(12) United States Patent
Nonis et al.

(10) Patent No.: US 9,571,108 B2
(45) Date of Patent: Feb. 14, 2017

(54) MULTI-OUTPUT PHASE DETECTOR

(71) Applicant: Infineon Technologies AG, Neubiberg (DE)

(72) Inventors: Roberto Nonis, Warmbad-Villach (AT); Nicola DaDalt, Villach (AT); Edwin Thaller, Faak am See (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/543,783

(22) Filed: Nov. 17, 2014

(65) Prior Publication Data
US 2015/0070060 A1   Mar. 12, 2015

Related U.S. Application Data

(63) Continuation of application No. 13/651,415, filed on Oct. 13, 2012, now Pat. No. 8,890,592.

(51) Int. Cl.
| | |
|---|---|
| *H03L 7/06* | (2006.01) |
| *H03L 7/085* | (2006.01) |
| *H03L 7/091* | (2006.01) |
| *H03L 7/18* | (2006.01) |
| *H03L 7/099* | (2006.01) |
| *H03K 5/00* | (2006.01) |

(52) U.S. Cl.
CPC ............. *H03L 7/085* (2013.01); *H03L 7/091* (2013.01); *H03L 7/0991* (2013.01); *H03L 7/18* (2013.01); *H03K 2005/00058* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,970,046 B2 * | 11/2005 | Da Dalt ................. | H03L 7/085 327/156 |
| 7,042,972 B2 * | 5/2006 | Fahim ................... | H03D 13/004 327/156 |
| 8,638,146 B1 * | 1/2014 | Lamanna ............... | H03L 7/085 327/156 |
| 2004/0202271 A1 * | 10/2004 | Fahim ................... | H03D 13/004 375/376 |
| 2007/0159260 A1 * | 7/2007 | Beyer .................... | H03L 7/1976 331/10 |
| 2007/0176657 A1 * | 8/2007 | Byun ...................... | H03K 5/13 327/158 |
| 2008/0164890 A1 * | 7/2008 | Admon .................. | H04L 12/10 324/713 |
| 2009/0206941 A1 * | 8/2009 | Wang .................... | H03C 3/0925 332/119 |
| 2010/0134160 A1 * | 6/2010 | Min ....................... | H03L 7/085 327/156 |
| 2011/0007859 A1 * | 1/2011 | Ueda ..................... | H03L 7/0802 375/376 |
| 2011/0095795 A1 * | 4/2011 | Kim ....................... | G11C 7/22 327/158 |

(Continued)

*Primary Examiner* — Adam Houston
(74) *Attorney, Agent, or Firm* — Eschwaller & Associates, LLC (57) ABSTRACT

Representative implementations of devices and techniques provide a multi-bit binary representation of a phase difference between two signals. The multi-bit binary representation may include information regarding a sign of the phase difference and a magnitude of the phase difference.

22 Claims, 8 Drawing Sheets

(56) References Cited

U.S. PATENT DOCUMENTS

| | | | |
|---|---|---|---|
| 2012/0007646 A1* | 1/2012 | Yun | H03L 7/0814 327/158 |
| 2012/0013406 A1* | 1/2012 | Zhu | H03L 7/0992 331/34 |
| 2012/0062294 A1* | 3/2012 | Choi | H03L 7/0814 327/158 |
| 2012/0183104 A1* | 7/2012 | Hong | H03L 7/085 375/340 |
| 2012/0194239 A1* | 8/2012 | Jang | G11C 7/222 327/158 |
| 2013/0002319 A1* | 1/2013 | Yeo | H03K 23/52 327/157 |
| 2013/0147531 A1* | 6/2013 | Lee | H03L 7/085 327/158 |
| 2013/0191061 A1* | 7/2013 | Wang | G06F 10/005 702/66 |
| 2013/0257494 A1* | 10/2013 | Nikaeen | H03M 3/458 327/156 |
| 2013/0278303 A1* | 10/2013 | Chen | H03L 7/101 327/117 |
| 2014/0103976 A1* | 4/2014 | Nonis | H03L 7/091 327/158 |
| 2014/0266354 A1* | 9/2014 | Boo | H03L 7/08 327/159 |

\* cited by examiner

MULTI-OUTPUT PHASE DETECTOR

BACKGROUND

Phase-locked-loop (PLL) devices are control systems that generate signals having a fixed relationship to the phase of a reference signal. Typically, a phase-locked loop device generates a desired signal in response to both the frequency and the phase of the reference signal as well as a control signal. Often this includes raising or lowering the frequency of a frequency generator, such as a digitally controlled oscillator (DCO), until a modified form (a fraction, for example) of the oscillator output signal is matched with the reference signal in both frequency and phase. Phase-locked loops are widely used in radio, telecommunications, computers, and other electronic applications.

PLL devices generally include a phase detector (such as a binary phase detector, for example) which detects whether the phase of the modified output signal (e.g., the output of the DCO divided by a divider value) leads or lags the phase of the reference signal. This allows the PLL device to "lock" to the desired frequency, and provide a constant PLL output frequency. The DCO raises or lowers its output frequency based on the output of the phase detector, for example.

However, the properties of binary phase detectors (a.k.a. bang-bang phase detectors) may be highly non-linear. For example, the response of the phase frequency detection may not depend on the actual phase error, but rather on the sign of the error. This presents limits on the response capabilities of the PLL, including inhibiting frequency modulation applications of the PLL. For example, high data-rate frequency shift keying (FSK) modulation uses high-frequency deviation values, beyond the capability of a typical binary phase detector. Additionally, the non-linearity of a binary phase detector implies that the instantaneous gain of the PLL depends on the instantaneous phase error, which makes the overall bandwidth of the PLL not constant, but rather unpredictable.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide a multi-bit binary representation of a phase difference between two signals. For example, a multi-output phase detector may output the multi-bit representation to control a digitally controlled oscillator (DCO) of a phase-locked loop (PLL) device. The multi-bit representation may represent the phase difference between a reference signal and a modified output signal from the DCO. The multi-bit binary representation may include information regarding a sign of the phase difference and a magnitude of the phase difference.

In one implementation, the multi-bit representation is produced using a plurality of delay components and a plurality of logic components. For example, the plurality of delay components may determine the outputs at the plurality of logic components, which determine the multi-bit representation. In alternate implementations, the plurality of delay components may be arranged in a parallel or a serial manner. The delay components can determine the magnitude as well as the sign (i.e., polarity) of the phase difference.

Various implementations and arrangements are discussed with reference to electrical and electronics components and circuits. While specific components are mentioned, this is not intended to be limiting, and is for ease of discussion and illustrative convenience. The techniques and devices discussed with reference to a PLL arrangement are applicable to various types or designs of PLL arrangements, circuits (e.g., integrated circuits, analog circuits, digital circuits, mixed circuits, etc.), groups of components, structures, and the like.

Implementations are explained in more detail below using a plurality of examples. Although various implementations and examples are discussed here and below, further implementations and examples may be possible by combining the features and elements of individual implementations and examples.

Example PLL

Figure 1:
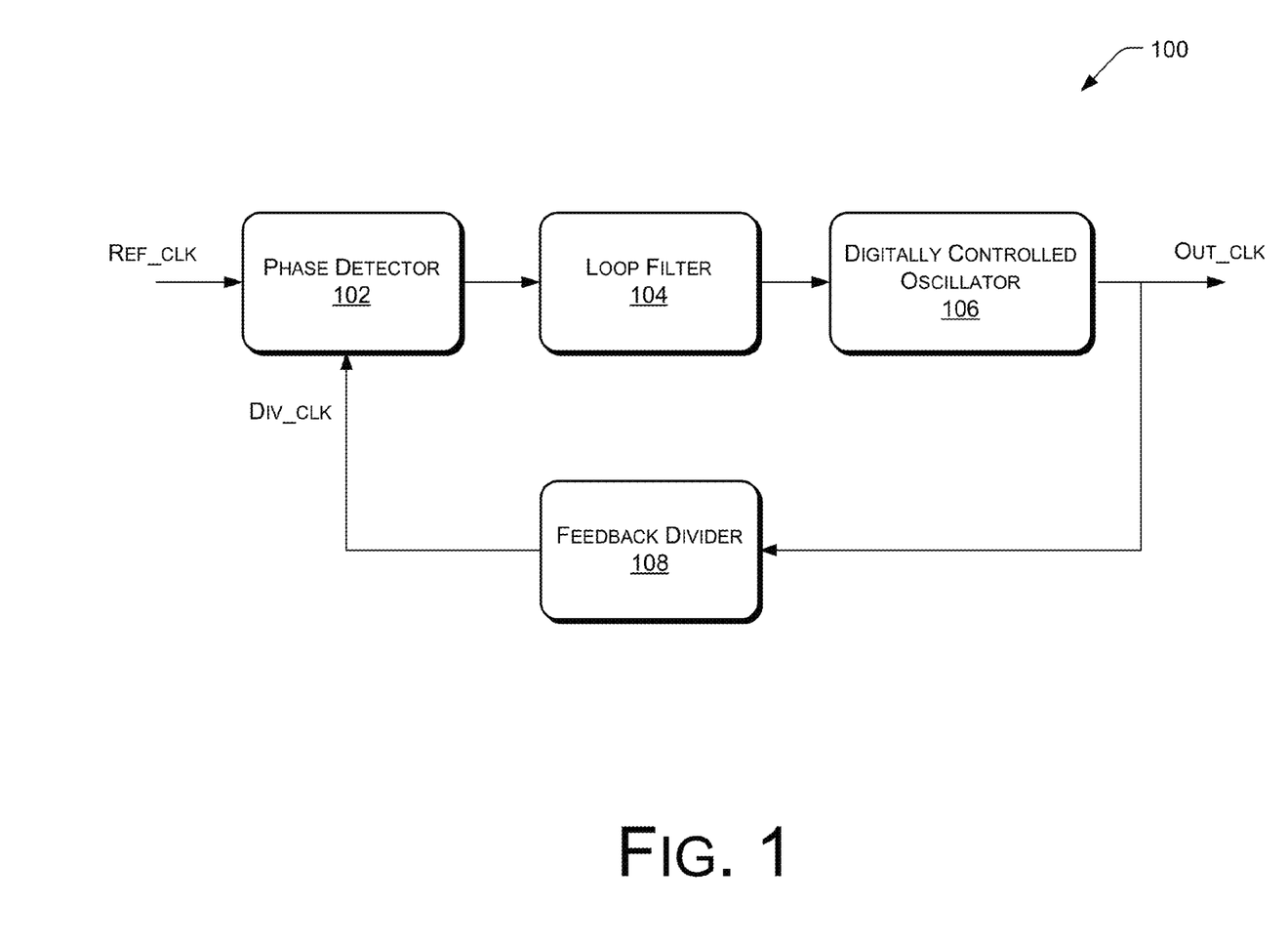
FIG. 1 is block diagram of an example PLL circuit, according to an implementation.

FIG. 1 is block diagram of an example PLL arrangement ("PLL") 100, according to an implementation. The PLL 100 represents an example environment whereby the techniques and devices discussed herein may be applied. The techniques, components, and devices described herein with respect to the PLL 100 are not limited to the illustration in FIG. 1, and may be applied to other designs, types, and constructions of PLLs or other similar structures without departing from the scope of the disclosure. In some cases, alternative components may be used to implement the techniques described herein.

In an example implementation, as shown in FIG. 1, the PLL 100 may include a phase detector 102, a loop filter 104, a digitally controlled oscillator (DCO) 106, and a feedback divider 108. In general terms, the DCO 106 may be arranged to produce an output signal (out_clk) having a frequency proportional to a value of a digital control word. The digital control word is the result of a reference clock signal (ref_clk) and a modified clock signal (div_clk) based on the output out clk of the DCO 106, and is used to adjust or "lock" the frequency of the DCO 106 to a desired output frequency. The output out clk of the DCO 106 is also the output of the PLL 100.

In an implementation, the feedback divider 108 is arranged to provide the modified clock signal div_clk based on the output signal out_clk from the DCO 106 and a divider value. For example, as shown in FIG. 1, the output out_clk of the DCO 106 is fed back through the feedback divider 108. The feedback divider 108 divides the frequency of the output signal out_clk by the divider value to produce the modified clock signal div_clk.

The reference clock signal ref_clk and the modified clock signal div_clk are received by the phase detector 102. In an implementation, the phase detector 102 senses a phase difference between the reference clock signal ref_clk and the modified clock signal div_clk and outputs a signal that is a representation of the phase difference detected. In one implementation, as discussed further below, the output of the phase detector 102 is a multi-bit representation of the phase difference. For example, the phase detector 102 may comprise a multi-output phase detector, arranged to detect whether and to what extent a phase of the reference clock signal ref_clk leads or lags a phase of the modified clock signal div_clk.

If included, the loop filter is arranged to form the digital control word based on the representation of the phase difference from the phase detector. In an implementation, the loop filter 104 comprises a digital loop filter. The digital control word may contain the phase difference information from the output of the phase detector. Accordingly, the digital control word prompts the DCO 106 to increase its output frequency or decrease its output frequency based on the phase difference indicated by the digital control word. For example, if the reference clock signal ref_clk is leading the modified clock signal div_clk, the digital control word may prompt the DCO 106 to increase its output frequency. Conversely, if the reference clock signal ref_clk is lagging the modified clock signal div_clk, the digital control word may prompt the DCO 106 to decrease its output frequency. In alternate implementations, this may occur in a different manner for the leading and lagging conditions.

In alternate implementations, variations of a PLL 100 are also within the scope of the disclosure. The variations may have fewer elements than illustrated in the example shown in FIG. 1, or they may have more or alternative elements than those shown.

Example Phase Detector

Figure 2A:
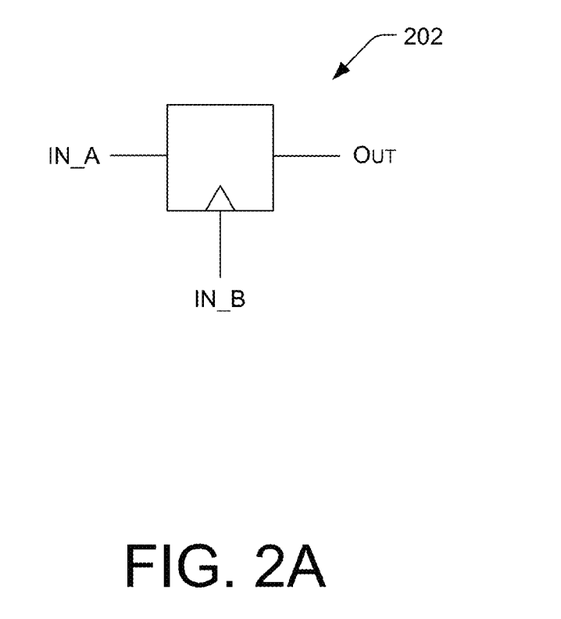
FIG. 2A is a schematic diagram of an example phase detector, which may be employed with the PLL circuit of FIG. 1, for example.

FIG. 2A is a schematic diagram of an example phase detector 202, which may be employed as the phase detector 102 with the PLL 100 of FIG. 1, for example. The phase detector 202 is shown as having two inputs (in_A and in_B) and an output "out." As described above, the phase detector 202 may be arranged to sense the phase difference or "phase error" between signals at the two inputs (in_A and in_B) and output a signal that represents the phase error. For example, regarding the PLL 100 discussed above, the phase detector 202 detects whether the reference clock signal rev_clk edge (at in_A, for example) leads or lags the modified clock signal div_clk edge (at in_B, for example).

Figure 2B:
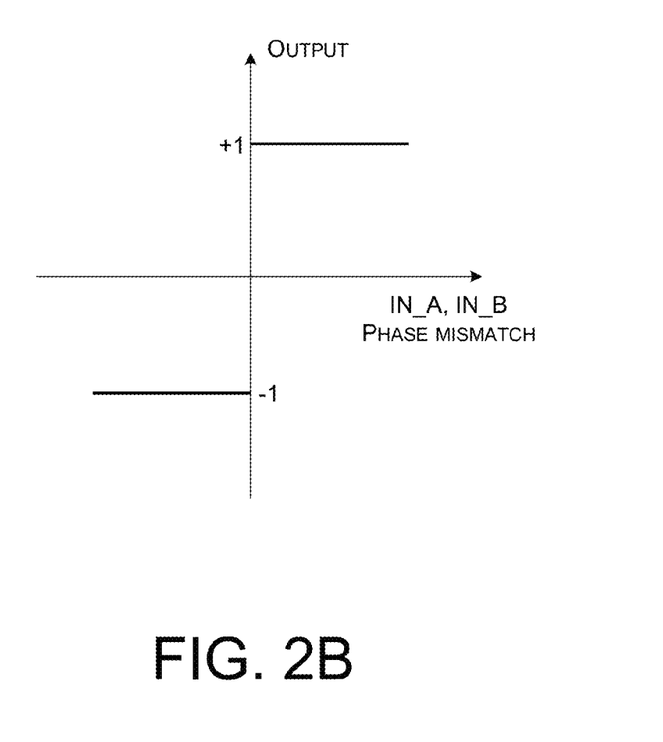
FIG. 2B is a signal diagram showing an example output of the phase detector of FIG. 2A.

In an implementation, the phase detector 202 is a binary (or "bang-bang") phase detector. In the implementation, the output of the phase detector 202 is a binary value, generally either a 1 or a 0, to indicate the leading or a lagging phase error. In some implementations, the output may be adjusted, as shown in FIG. 2B, from (1, −1) to indicate the leading or a lagging phase error. This adjustment may be performed and/or used by devices or circuits of the PLL 100 that make use of the phase information.

In general, a phase detector 202 has a single binary output "out," indicating a sign (i.e., polarity, leading or lagging, etc.) of the phase error, but not a magnitude of the phase error. In the implementation, the output of the phase detector 202 does not provide information to the DCO 106 about how much (to what extent) to increase or decrease the output frequency of the DCO 106 to correct the phase error.

FIG. 2B is a signal diagram showing an example output of the phase detector 202 of FIG. 2A. As shown in the diagram, the output of the phase detector 202 is either a 1 or a −1, depending on the sign of the phase error, and regardless of the magnitude of the phase error. In case of large jitter values between the inputs (in_A and in_B), the phase detector may have a limited detection capability, which may lead to sub-optimal jitter performance of the PLL 100.

Additionally, the phase detector 202 may not be suitable for high frequency deviation values or large changes in frequency (such as those used with frequency shift keying (FSK) modulation). This limits the capability of the PLL 100, and restricts its use to applications having small frequency deviations and/or slow data rates.

Example Multi-Output Phase Detector

Figure 3:
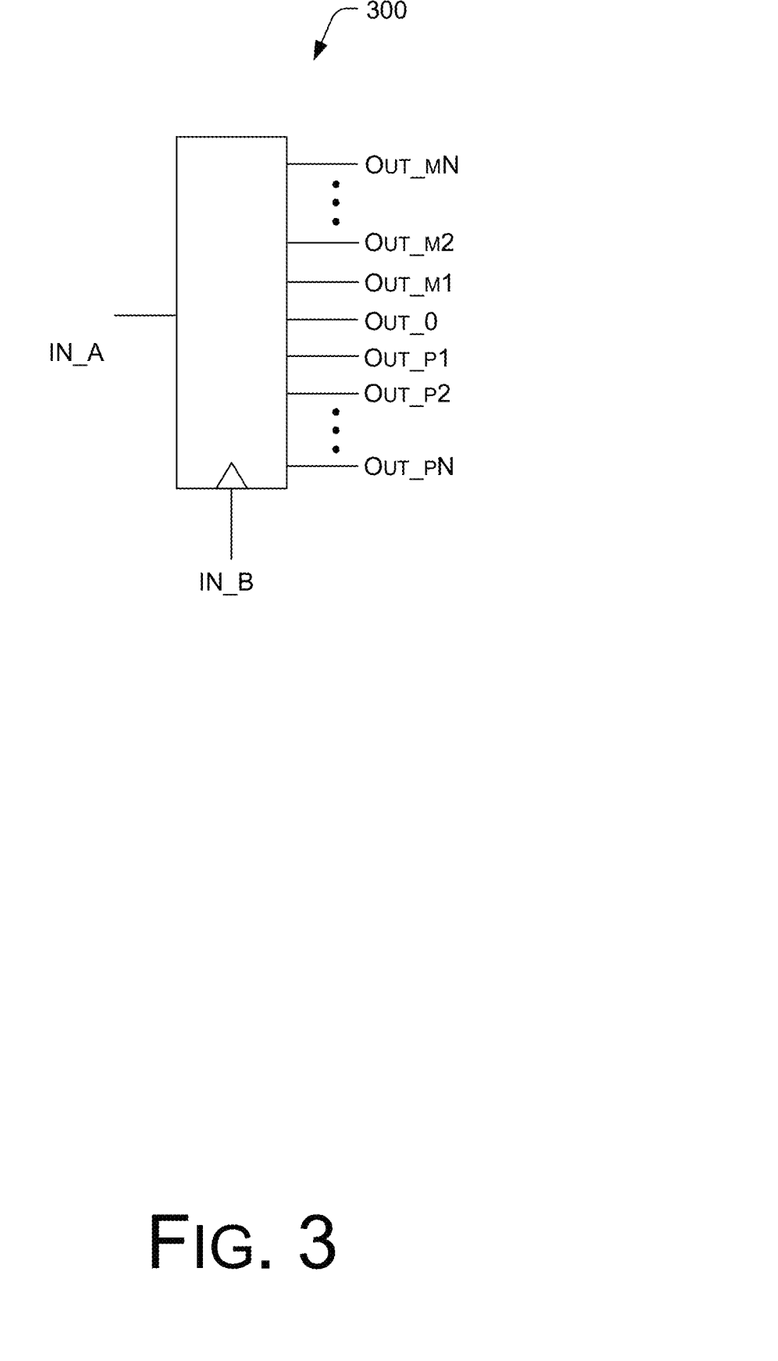
FIG. 3 is a schematic diagram of an example multi-output phase detector, according to an implementation.

FIG. 3 is a schematic diagram of an example multi-output (MO) phase detector 300, which may be employed as the phase detector 102 with the PLL 100 of FIG. 1, according to an implementation. The MO phase detector 300 is shown as having two inputs (in_A and in_B) and multiple outputs (out_mN, . . . , out_m2, out_m1, out_0, out_1, out_p2, . . . , out_pN). The number of outputs may vary, based on the application of the PLL 100 and the desired bandwidth of the MO phase detector 300. In an implementation, there are an equal number of positive outputs "out_px" (N positive outputs are shown in FIG. 3) as negative outputs "out_mx" (N negative outputs are shown in FIG. 3) to represent leading and lagging values. The MO phase detector 300 may be comprised of multiple elements associated with the multiple outputs, according to various implementations, discussed further below.

As described above, the phase detector 300 may be arranged to sense the instantaneous phase difference or "phase error" between signals at the two inputs (in_A and in_B) and output a signal that represents the phase error. For example, regarding the PLL 100 discussed above, the phase detector 300 detects whether and to what extent the reference clock signal ref_clk edge (at in_A, for example) leads or lags the modified clock signal div_clk edge (at in_B, for example).

In an implementation, the output of the MO phase detector 300 is a multi-bit representation of the phase difference between the signals at the two inputs (in_A and in_B). In an implementation, the output is a multi-bit binary "word," generally comprising 1's and/or 0's, to indicate the leading or lagging phase error, in sign (i.e., polarity, leading or lagging, etc.) and magnitude. In an implementation, each of the outputs of the MO phase detector 300 outputs a single binary value, and when combined, form the multi-bit binary representation of the phase error. For example, the pattern of the outputs forming the multi-bit binary representation represents an "incremental phase-mismatch," where a transition between adjacent 1's and adjacent 0's represents a predetermined phase-mismatch range.

In some implementations, the output of the MO phase detector 300 may be adjusted to include 1's and/or −1's (e.g., accumulations and de-accumulations) to indicate the phase error instead of 1's and 0's. This adjustment may be performed and/or used by devices or circuits of the PLL 100 that make use of the phase information (such as the loop filter 104, for example).

Figure 4:
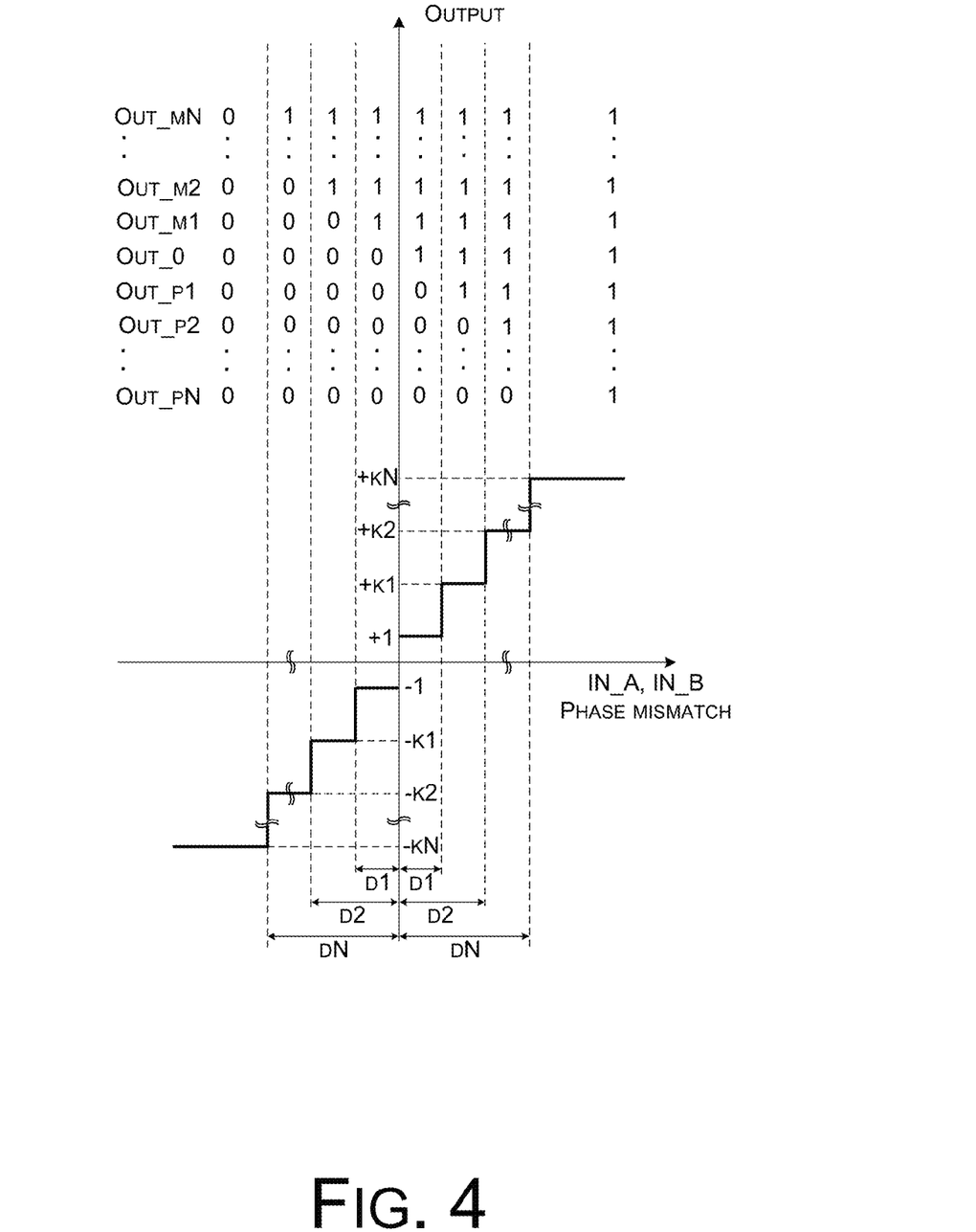
FIG. 4 is a function diagram showing an example output of the multi-output phase detector of FIG. 3, according to an implementation.

FIG. 4 is a function diagram showing example outputs of the MO phase detector 300 of FIG. 3, according to an implementation. FIG. 4 illustrates the characteristic function of the MO phase detector 300 (e.g., the loop filter 104 interpretation of the multi-bit binary representation, for example) and possible binary values at the outputs (out_mN, . . . , out_m2, out_m1, out_0, out_p1, out_p2, . . . , out_pN) based on the sign and magnitude of the phase error, and based on example delays (D1, D2, . . . , DN). The possible binary values are displayed above the characteristic in FIG. 4.

For example, a negative delay value of DN on the functional characteristic may indicate a phase error having a negative polarity (the reference clock signal ref_clk lags the modified clock signal div_clk, for example) and a magnitude equal to the predetermined value of DN. In the example, the multi-bit binary representation of the phase difference at the outputs of the MO phase detector 300 may be "0..00000..1."

In another example, a positive delay value of D2 on the functional characteristic may indicate a phase error having a positive polarity (the reference clock signal ref_clk leads the modified clock signal div_clk, for example) and a magnitude equal to the predetermined value of D2. In the example, the multi-bit binary representation of the phase difference at the outputs of the MO phase detector 300 may be "0..01111..1." Again, the number of bits (or binary outputs of the MO phase detector 300) determines the resolution of the MO phase detector 300. This also determines the capability of the PLL 100 to accommodate faster and greater frequency deviations.

The additional information provided by the MO phase detector 300 (e.g., sign and magnitude of the phase error) in the form of the multi-bit binary representation makes a PLL 100 performance more linear and makes it possible for the PLL 100 to track modulation of the loop parameters (such as the feedback divider ratio, for example), which is important for implementing high frequency applications such as FSK modulation. In an implementation, the phase noise performance is preserved using the MO phase detector 300, and the bandwidth of the PLL 100 does not depend as strongly on the noise as does a PLL 100 using the phase detector 202.

In an implementation, the delay values D1, D2, . . . , DN represent values used for determining a phase difference or "phase error" between signals at the two inputs (in_A and in_B). For example, the delay values D1, D2, . . . , DN may represent time delays, where the phase difference between the input signals (in_A and in_B) is related to a time difference in the occurrence of corresponding points on the input signals (in_A and in_B). Referring to FIG. 4, in one implementation, the delay values D1, D2, . . . , DN comprise time values. In alternate implementations, the delay values D1, D2, . . . , DN may comprise other values arranged to indicate or quantify time relative to phase difference. In various implementations, the delay value D may be predetermined, programmable, adjustable, and the like, to provide the desired delay values. For example, the values of D1, D2, and DN may be multiples of the delay value D. In an implementation, the value D is selected based on the desired bandwidth of the MO phase detector 300, in combination with the number of outputs of the MO phase detector 300.

In an implementation, as shown in FIG. 4, the value k represents a factor implemented into the loop filter 104 to represent accumulated (or de-accumulated) values proportional to the magnitude of the phase error. In various implementations, the value k may be predetermined, programmable, adjustable, and the like, to provide the desired accumulation factors for the loop filter 104. For example, the values +kN, . . . , +k2, +k1, −k1, −k2, . . . , −kN may be multiples of the accumulation factor k. In an implementation, the accumulated (or de-accumulated) values determine the amount or extent of frequency adjustment made by the DCO 106.

In an implementation, as shown in FIG. 4, for small phase errors, the function of the MO phase detector 300 may resemble the function of a phase detector 202. For example, the functional characteristic of the MO phase detector 300 for delay values of positive and negative D1 resembles the functional characteristic of the phase detector 202 shown in FIG. 2B. In an implementation, the information output from the MO phase detector 300 for predetermined small phase errors includes the sign without the magnitude of the phase error.

Example Implementations

Figure 5:
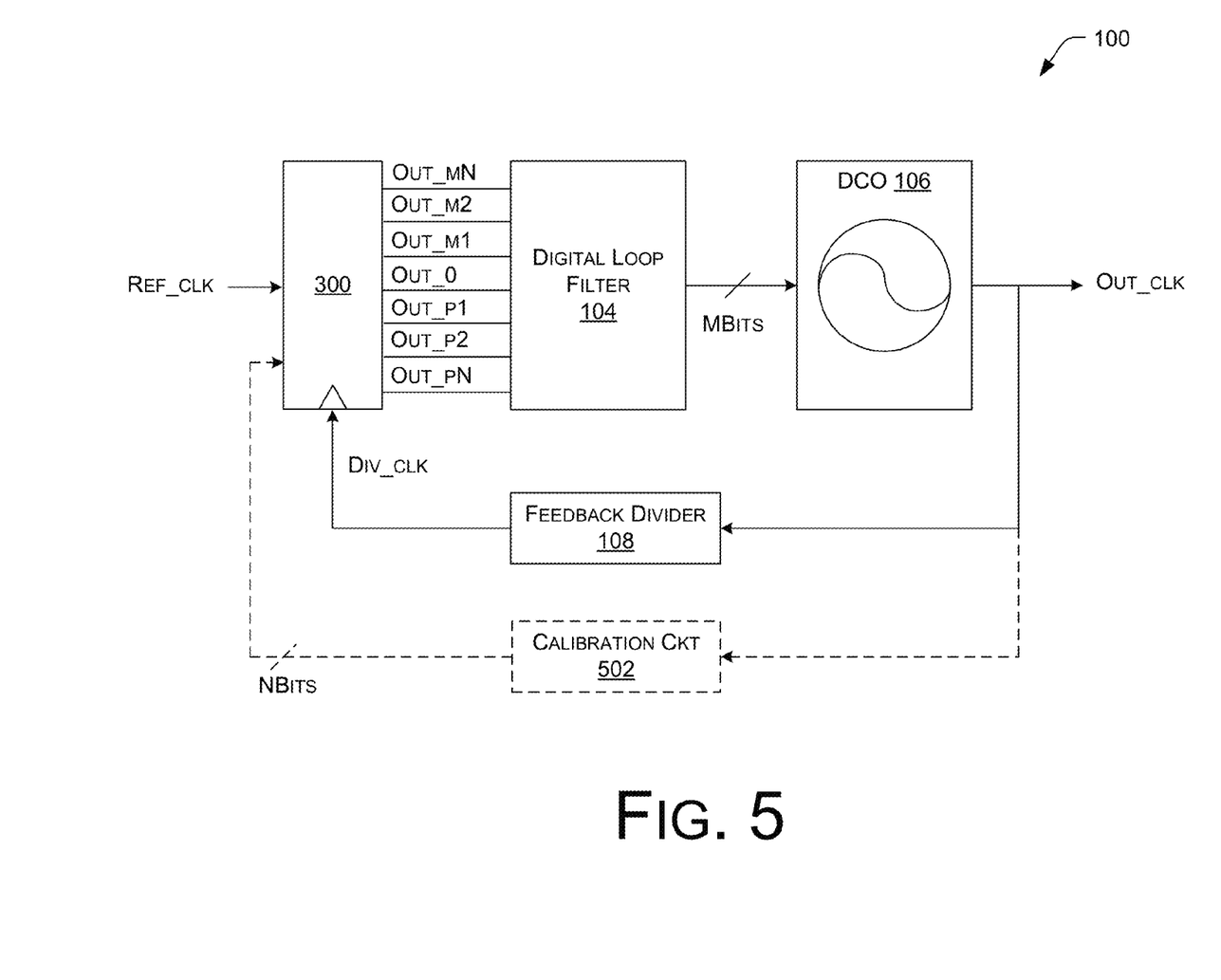
FIG. 5 is a block diagram of an example PLL circuit employing a multi-output phase detector, according to an implementation.

FIG. 5 is a block diagram of an example PLL 100 employing a MO phase detector 300, according to an implementation. As shown in FIG. 5, the PLL 100 also includes the digital loop filter 104, the digitally controlled oscillator (DCO) 106, and the feedback divider 108, as discussed above. In alternate implementations, the PLL 100 may include fewer, additional, or alternate components and remain within the scope of the disclosure.

In an implementation, the DCO 106 produces an output signal (out_clk) having a frequency proportional to a value of a digital control word. As discussed, the digital control word may be output by the digital loop filter 104. The digital control word is the result of the reference clock signal (ref_clk) and the modified clock signal (div_clk), and is used to adjust or "lock" the frequency of the DCO 106 to the desired output frequency.

In an implementation, the feedback divider 108 provides the modified clock signal div_clk based on the output signal out_clk from the DCO 106 and a divider value. For example, as shown in FIG. 5, the output out_clk of the DCO 106 is fed back through the feedback divider 108. The feedback divider 108 multiplies the frequency of the output signal out_clk by the divider value to produce the modified clock signal div_clk. In an implementation, the divider value is dynamically adjustable to follow desired frequency changes for the PLL 100. In various implementations, the divider value is an integer or a fractional division ratio.

The reference clock signal ref_clk and the modified clock signal div_clk are received by the MO phase detector 300 (a.k.a. multi-output bang-bang phase detector). In an implementation, the MO phase detector 300 senses an instantaneous phase difference (or phase error) between the reference clock signal ref_clk and the modified clock signal div_clk and outputs a multi-bit representation of the phase difference. In an implementation, the MO phase detector 300 detects whether and to what extent the phase of the reference clock signal ref_clk leads or lags the phase of the modified clock signal div_clk. This information (to what extent the phase of the reference clock signal ref_clk leads or lags the phase of the modified clock signal div_clk) is represented in the multi-bit representation of the phase difference outputted by the MO phase detector 300.

In an implementation, the multi-bit representation comprises a binary word of predetermined length including information about a polarity (or sign) of the phase difference and a magnitude of the phase difference.

In one implementation, the digital loop filter 104 receives the information on the phase mismatch from the MO phase detector 300 and forms or adjusts the digital control word based on the multi-bit representation of the phase difference. Accordingly, the digital control word prompts the DCO 106 to increase its output frequency or decrease its output frequency based on the phase difference indicated by the digital control word.

Due to the use of the MO phase detector 300, the PLL 100 can track a modulation of the divider value (of the feedback divider 108) during frequency-shift-keying (FSK) modulation for high frequency deviation values. For example, the divider value changes rapidly between frequency divisions (i.e., fractional mode). This is also the case (i.e., larger phase errors and/or rapid frequency changes) while the PLL 100 is acquiring "lock," and other similar situations.

In an implementation, the PLL 100 includes an optional calibration circuit 502 arranged to calibrate the MO phase detector 300. For example, the calibration circuit 502 may be arranged to select the delay values (DN, . . . , D2, D1) for the MO phase detector 300.

Figure 6A:
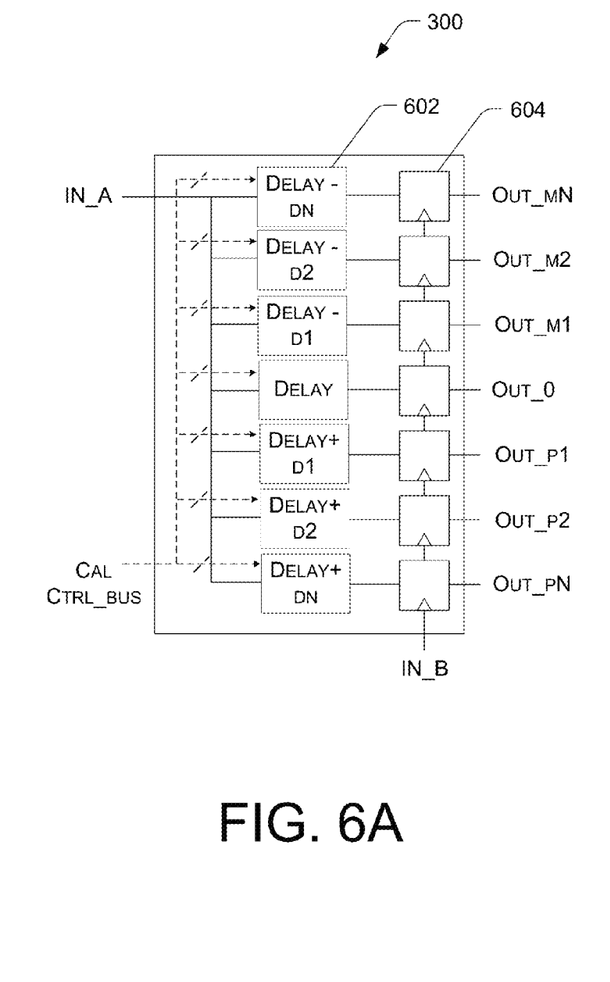
FIGS. 6A and 6B show two implementations of example multi-output phase detectors, which may be employed with the PLL circuit of FIG. 5, for example.
Figure 6B:
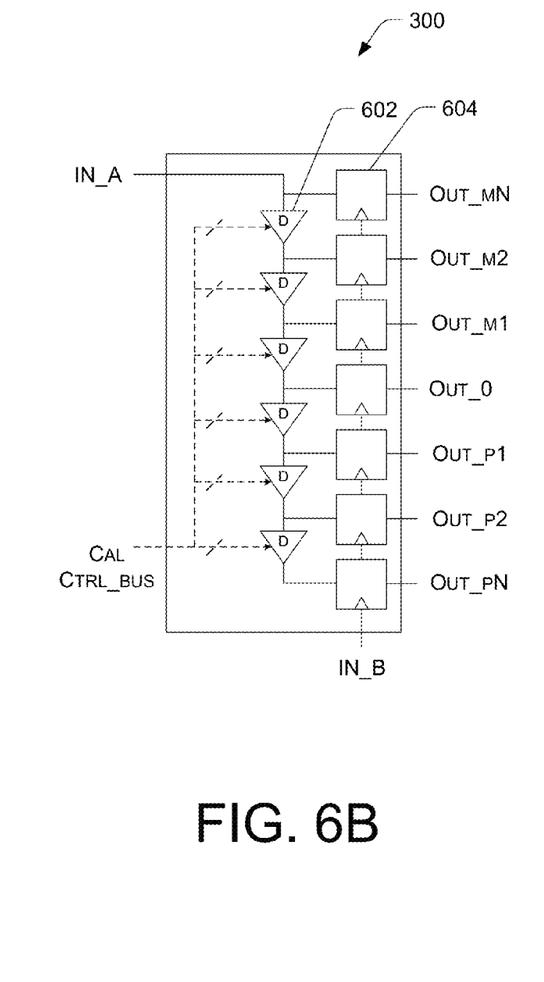

FIGS. 6A and 6B show two implementations of example MO phase detectors 300, which may be employed with the PLL 100 of FIG. 5, for example. In the implementations, each of the MO phase detectors 300 of FIGS. 6A and 6B include a plurality of delay components 602 coupled to the first input (in_A) of the MO phase detectors 300.

Further, the MO phase detectors 300 include a plurality of logic components 604 coupled to the plurality of delay components 602 and coupled to a second input (in_B) of the MO phase detectors 300.

The plurality of logic components 604 have a plurality of outputs (out mN, . . . , out_m2, out_m1, out_0, out_p1, out_p2, . . . , out_pN) arranged to output a multi-bit binary representation of a phase difference between a signal at the first input (in_A) and another signal at the second input (in_B). In an implementation, the MO phase detectors 300 detect whether and to what extent the signal at the first input (in_A) is leading or lagging the other signal at the second input (in_B). For example, the binary representation of the phase difference includes information about a sign of the phase difference and a magnitude of the phase difference.

In an implementation, each of the plurality of logic devices 604 comprises a single binary sampling circuit. For example, the logic devices 604 may comprise a sampling flip-flop, or like circuit or device.

In an implementation, as shown in FIG. 6A, a MO phase detector 300 may be arranged such that the delay components 602 are arranged in parallel, and delay values (DN, . . . , D2, D1) of each of the delay components 602 are substantially different from each other. For example, in an implementation, the delay values (DN, . . . , D2, D1) are multiples of the value D. In alternate implementations, the delay values (DN, . . . , D2, D1) are selectable, programmable, adjustable, and the like.

In an implementation, each delay component 602 corresponds to a phase shift shown in FIG. 4 (e.g., DN, . . . , D2, D1). For example, the phase error may be compared to each of the delay components 602 individually and/or in parallel. Accordingly, the binary representation of the phase difference is a result of the comparison of the phase difference to a delay value (DN, . . . , D2, D1) of one or more of the delay components 602. In an implementation, each of the delay components 602 feeds a bang-bang phase detector (i.e., a logic component 604) having a binary output. In this way, the output of each logic component 604 is representative of the occurrence of the phase error between the inputs in_A and in_B falling into a given range (e.g., the given range of the corresponding delay component 602).

In an implementation, the delay components 602 are comprised of CMOS buffers with different capacitive loads. In alternate implementations, the delay components 602 are comprised of alternate elements arranged to provide the desired delay values (DN, . . . , D2, D1).

In an implementation, as shown in FIG. 6B, a MO phase detector 300 may be arranged such that the delay components 602 are arranged in series, and delay values D of each of the delay components 602 are substantially equal.

In an implementation, the binary representation of the phase difference is at least in part a result of summing the delay values D of a quantity of the delay components 602, the quantity of the delay components 602 summed being proportional to a magnitude of the phase difference. In alternate implementations, the delay values D are selectable, programmable, adjustable, and the like.

In an implementation, the delay components 602 comprise CMOS buffers with substantially equal capacitive loads. In alternate implementations, the delay components 602 are comprised of alternate elements arranged to provide the desired delay value D. In an implementation, the logic components 604 are comprised of sampling flip-flops, or the like.

In an alternate implementation, the MO phase detectors 300 include a calibration control bus arranged to allow the delay values of the delay components 602 to be selected or adjusted.

Figure 7:
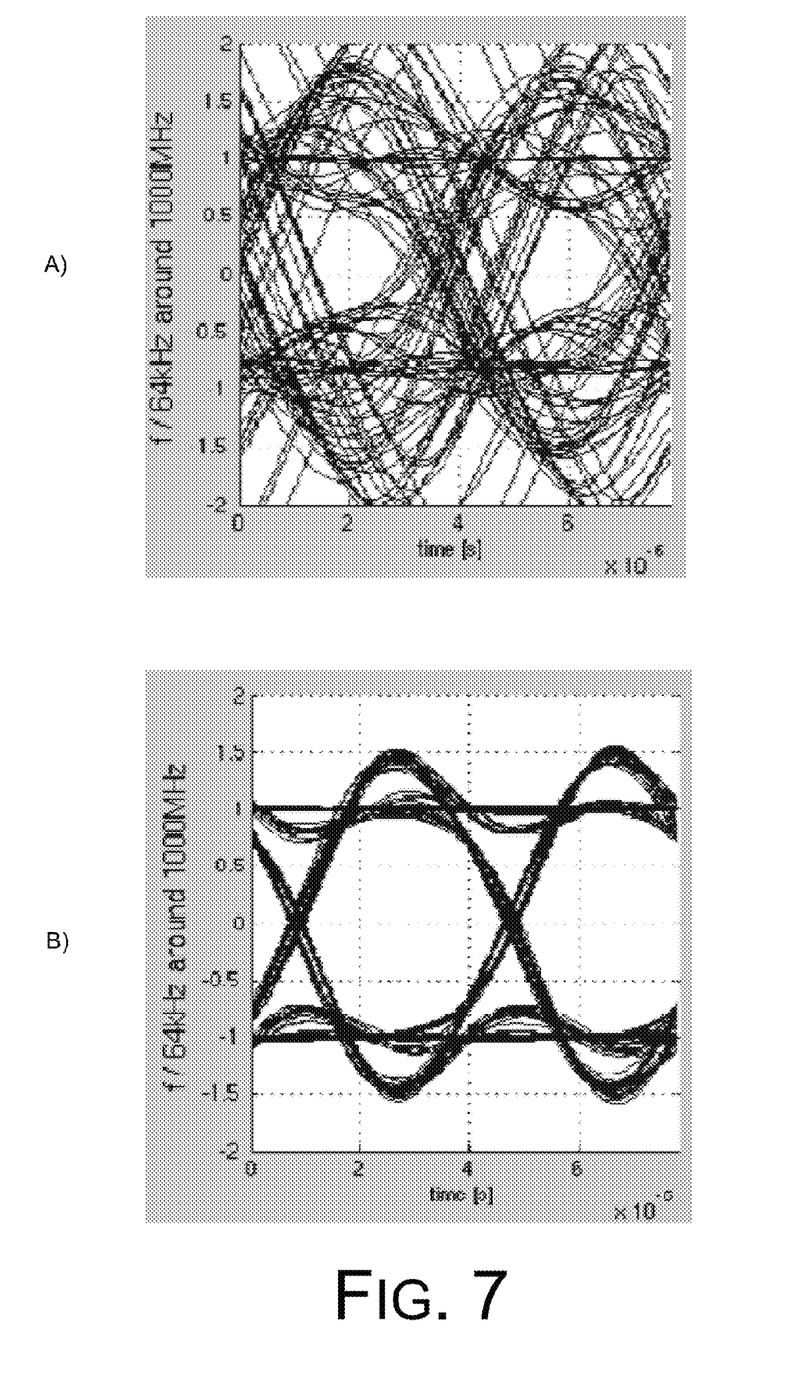
FIG. 7 illustrates a comparison of frequency modulation outputs, with and without a multi-output phase detector PLL, according to an implementation.

FIG. 7 illustrates a comparison of frequency modulation outputs, with and without a multi-output phase detector 300 PLL 100, according to an implementation. The plots of FIG. 7 show the frequency "eye-diagram" produced by the two topologies while modulating a carrier with frequency shift keying (FSK) modulation. The top plot (A) shows an output from a PLL 100 having a phase detector 202 and the bottom plot (B) shows an output from a PLL 100 having a MO phase detector 300.

As shown in the top plot (A), the PLL 100 with the phase detector 202 is practically not able to produce a useful "eye" opening. This is due to the inability of the PLL 100 to track the high frequency deviations of the FSK modulation.

In contrast, as shown in the bottom plot (B), the PLL 100 with the phase detector 300 is capable of a nearly-ideal "eye" opening. This is due to the additional information available to the DCO 106, including sign and magnitude information of the phase error. This additional information allows the PLL 100 to track the high frequency deviations of the FSK modulation, including with high data rates.

In alternate implementations, various other combinations and systems including a MO phase detector 300 and/or a PLL 100 are also within the scope of the disclosure. The variations may have fewer elements than illustrated in the examples shown in FIGS. 5, 6A, and 6B, or they may have more or alternative elements than those shown.

Representative Process

Figure 8:
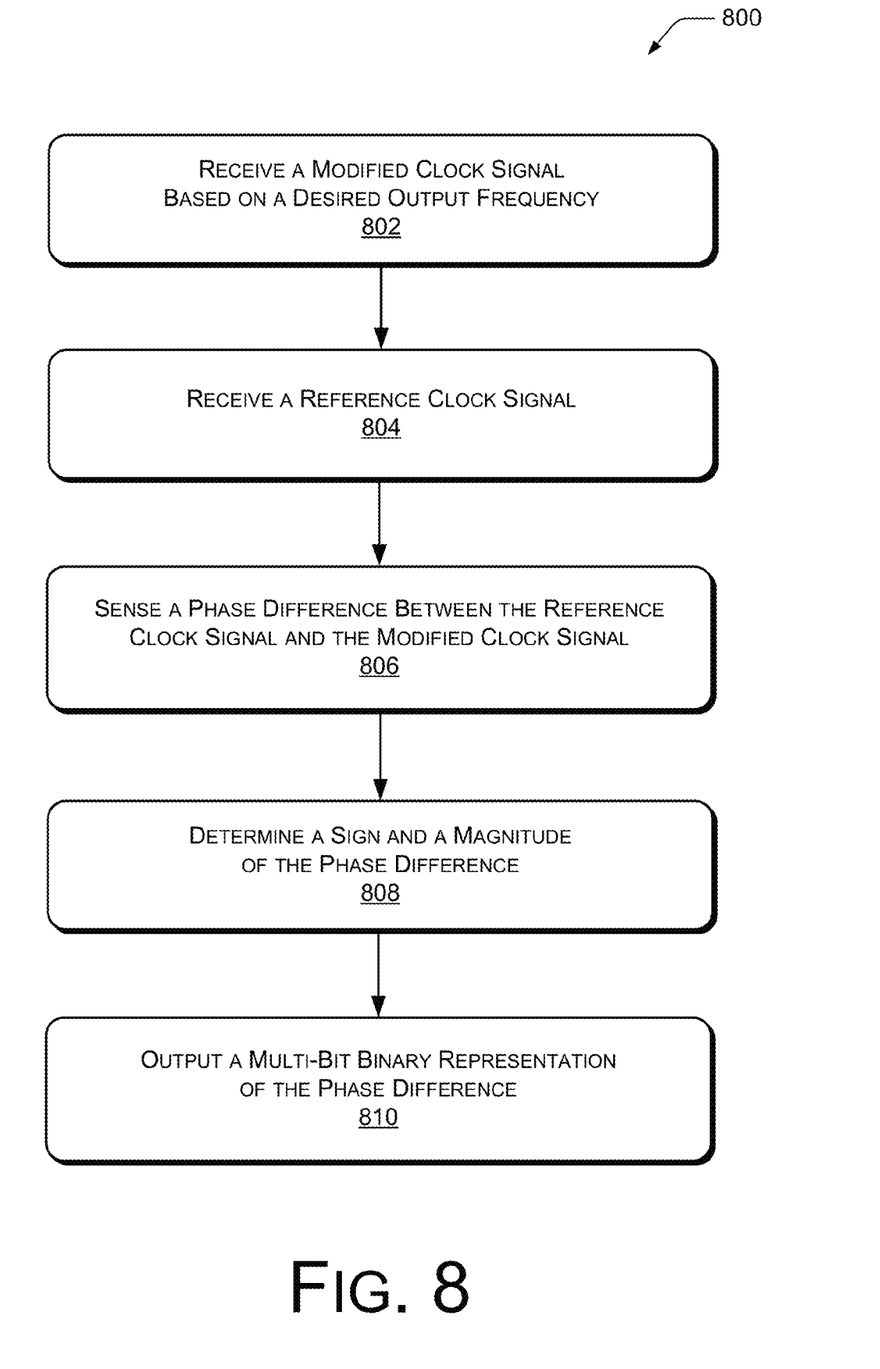
FIG. 8 is a flow diagram illustrating an example process for providing multiple phase detector outputs from a single phase detector, according to an implementation.

FIG. 8 is a flow diagram illustrating an example process 800 for providing multiple phase detector outputs from a single phase detector (such as MO phase detector 300, for example), according to an implementation. The process 800 is described with reference to FIGS. 1-4.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 802, the process includes receiving a modified clock signal (such as div_clk, for example) based on a desired output frequency. In an implementation, the modified clock signal is received at a first input of a multi-output (MO) phase detector, from a feedback divider (such as feedback divider 108, for example). For example, the modified clock signal may be a result of the output of a digitally controlled oscillator (DCO) (such as DCO 106, for example) multiplied by a divider value at the feedback divider.

At block 804, the process includes receiving a reference clock signal. For example, the MO phase detector may receive the reference clock signal at a second input.

At block 806, the process includes sensing a phase difference between the reference clock signal and the modified clock signal. The MO phase detector may detect the phase difference between clock edges of the two signals, for example. The phase difference indicates whether one of the signals leads or lags the other of the signals.

At block 808, the process includes determining a sign (i.e., polarity) and a magnitude of the phase difference. In an implementation, the MO phase detector compares the phase difference to one or more delay values to determine the sign and magnitude of the phase difference. In one implementation, the process includes determining whether and to what extent the reference clock signal leads or lags the modified clock signal.

At block 810, the process includes outputting a multi-bit binary representation of the phase difference. In an implementation, the MO phase detector outputs a binary representation of the phase difference, such as a binary word, or the like, that includes information about a sign of the phase difference and a magnitude of the phase difference.

In an implementation, the MO phase detector is comprised of multiple delay components (such as delay components 602, for example) and multiple logic components (such as logic components 604, for example). For example, the multiple delay components may be used to determine the sign and magnitude of the phase difference and the logic components may be used to output the phase difference information.

In one implementation, the process includes comparing the phase difference to a delay value of one or more delay components, where the one or more delay components represent a predetermined phase-mismatch range. In another implementation, the process includes outputting the multi-bit binary representation based on summing delay values of a quantity of the one or more delay components. In a further implementation, the process includes programming and/or adjusting the delay value of one or more of the delay components.

In alternate implementations, the process includes calibrating the MO phase detector, the delay components, the delay values, or the like.

In one implementation, the process includes outputting the multi-bit binary representation in parallel from a plurality of individual binary phase detectors. For example, the MO phase detector may be comprised of multiple individual binary phase detectors, where each of the individual binary phase detectors represent a phase mismatch range.

In one implementation, the process includes forming a digital control word based on the binary representation of the phase difference, where the digital control word determines an output frequency of a digitally controlled oscillator, and the output frequency is proportional to a numerical value of the digital control word. In the implementation, the modified clock signal is derived from the output frequency of the digitally controlled oscillator.

In alternate implementations, other techniques may be included in the process 800 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A system, comprising:
a digitally-controlled oscillator (DCO), arranged to produce an output signal having a frequency proportional to a value of a digital control word;
a feedback divider arranged to provide a modified clock signal based on the output signal;
a multi-output phase detector arranged to sense a phase difference between a reference clock signal and the modified clock signal and to output a multi-bit representation of the phase difference; and
a digital loop filter arranged to form the digital control word based on the multi-bit representation.

2. The system of claim 1, wherein the multi-output phase detector is arranged to detect whether and to what extent a phase of the reference clock signal leads or lags a phase of the modified clock signal.

3. The system of claim 1, wherein the multi-bit representation comprises a binary word of predetermined length and includes information about a polarity of the phase difference and a magnitude of the phase difference.

4. A method, comprising:
receiving a clock signal;
receiving a reference clock signal;
sensing a phase difference between the reference clock signal and the clock signal;
determining a sign and a magnitude of the phase difference;
outputting a multi-bit binary representation of the phase difference.

5. The method of claim 4, further comprising determining whether and to what extent the reference clock signal leads or lags the clock signal.

6. The method of claim 4, further comprising comparing the phase difference to a delay value of one or more delay components, the one or more delay components representing a predetermined phase-mismatch range.

7. The method of claim 6, further comprising outputting the multi-bit binary representation based on summing delay values of a quantity of the one or more delay components.

8. The method of claim 6, further comprising programming and/or adjusting the delay value of the one or more delay components.

9. The method of claim 4, further comprising outputting a binary representation of the phase difference that includes information about a sign of the phase difference and a magnitude of the phase difference.

10. The method of claim 4, further comprising outputting the multi-bit binary representation in parallel from a plurality of individual binary phase detectors.

11. The method of claim 4, further comprising forming a digital control word based on the binary representation of the phase difference, the digital control word arranged to determine an output frequency of a digitally controlled oscillator, wherein the output frequency is proportional to a numerical value of the digital control word.

12. The method of claim 11, wherein the clock signal is derived from the output frequency of the digitally controlled oscillator.

13. A device, comprising:
a plurality of delay components coupled to a first input of the device, one or more of the delay components having a delay value that is programmable and/or adjustable; and
a plurality of components coupled to the plurality of delay components and coupled to a second input of the device, the plurality of components having a plurality of outputs arranged to output a binary representation of a phase difference between a signal at the first input of the device and another signal at the second input of the device.

14. The device of claim 13, wherein the delay components are arranged in series, and delay values of each of the delay components are substantially equal.

15. The device of claim 14, wherein the binary representation of the phase difference is at least in part a result of summing the delay values of a quantity of the delay components, the quantity of the delay components summed being proportional to a magnitude of the phase difference.

16. The device of claim 15, wherein the delay components comprise CMOS buffers with substantially equal capacitive loads.

17. The device of claim 13, wherein the delay components are arranged in parallel, and delay values of each of the delay components are substantially different from each other.

18. The device of claim 17, wherein the binary representation of the phase difference is a result of a comparison of the phase difference to a delay value of one or more of the delay components.

19. The device of claim 17, wherein the delay components comprise CMOS buffers with different capacitive loads.

20. The device of claim 13, wherein each of the plurality of devices comprises a single binary sampling circuit.

21. The device of claim 13, wherein the device is arranged to detect whether and to what extent the signal at the first input is leading or lagging the other signal at the second input.

22. The device of claim 13, wherein the binary representation of the phase difference includes information about a sign of the phase difference and a magnitude of the phase difference.

* * * * *